United States Patent [19]

Beyers, Jr.

[11] Patent Number: 4,905,187

[45] Date of Patent: Feb. 27, 1990

[54] TIME-KEEPING APPARATUS

[75] Inventor: Billy W. Beyers, Jr., Greenfield, Ind.

[73] Assignee: RCA Lincensing Corporation, Princeton, N.J.

[21] Appl. No.: 202,657

[22] Filed: May 20, 1988

Related U.S. Application Data

[63] Continuation of Ser. No. 824,674, Jan. 31, 1986, abandoned.

[51] Int. Cl.[4] ........................ G06F 11/00; G11C 7/00

[52] U.S. Cl. .................................... 364/900; 365/229; 364/707; 364/483; 368/10

[58] Field of Search ............... 364/900, 705, 707, 483; 365/229; 368/10

[56] References Cited

U.S. PATENT DOCUMENTS

| | | | |
|---|---|---|---|
| 4,011,927 | 3/1977 | Smith | 307/246 |
| 4,075,699 | 2/1978 | Schneider et al. | 364/492 |
| 4,099,068 | 7/1978 | Kobayashi et al. | 340/654 |
| 4,203,153 | 5/1980 | Boyd | 364/200 |
| 4,218,876 | 8/1980 | Hashimoto et al. | 364/707 |
| 4,234,920 | 11/1980 | Van Ness et al. | 364/200 |
| 4,253,151 | 2/1981 | Bouve | 364/492 |
| 4,266,278 | 5/1981 | Ebihara et al. | 364/707 |
| 4,267,577 | 5/1981 | Hashimoto et al. | 364/707 |
| 4,323,987 | 4/1982 | Holtz et al. | 365/229 |
| 4,327,298 | 4/1982 | Burgin | 364/900 |
| 4,399,524 | 8/1983 | Muguruma et al. | 365/229 |
| 4,422,163 | 12/1983 | Oldenkamp | 365/229 |
| 4,431,134 | 2/1984 | Hendricks et al. | 365/229 |
| 4,466,074 | 8/1984 | Jindrick et al. | 364/707 |
| 4,467,434 | 8/1984 | Hurley et al. | 364/483 |
| 4,468,571 | 8/1984 | Heavey et al. | 307/66 |
| 4,486,847 | 12/1984 | Wattenhofer | 364/706 |
| 4,547,629 | 10/1985 | Corless | 365/229 |
| 4,560,887 | 12/1985 | Schneider | 307/66 |
| 4,573,117 | 2/1986 | Boney | 364/200 |
| 4,580,248 | 4/1986 | Imaizumi | 365/229 |
| 4,584,651 | 4/1986 | Carey, Jr. et al. | 364/569 |
| 4,590,553 | 5/1986 | Noda | 364/200 |
| 4,613,950 | 9/1986 | Knierim et al. | 364/569 |
| 4,649,373 | 3/1987 | Bland et al. | 364/707 |
| 4,658,352 | 4/1987 | Nagasawa | 364/200 |
| 4,662,736 | 5/1987 | Taniguchi et al. | 365/229 |
| 4,701,858 | 10/1987 | Stokes et al. | 364/483 |

FOREIGN PATENT DOCUMENTS

| | | | |
|---|---|---|---|
| 0052538 | 4/1977 | Japan | 364/707 |
| 0254214 | 12/1985 | Japan | 364/707 |

*Primary Examiner*—Gareth D. Shaw
*Assistant Examiner*—Viet Q. Nguyen
*Attorney, Agent, or Firm*—Eugene M. Whitacre; Peter M. Emanuel; Thomas F. Lenihan

[57] ABSTRACT

Time-keeping apparatus includes a microcomputer having a normal, relatively high power consumption mode of operation and a standby relatively low power consumption mode of operation. The AC power supply includes energy storage providing standby power for operation during power interruption. A controllable delay arrangement causes the microcomputer to operate in a cyclical mode with a relatively long duration in the standby mode of operation and a relatively short duration in the normal mode of operation. The time period of the relatively long duration, having been previously stored in memory, is utilized for incrementing the time-keeping during the relatively short duration in the normal mode until the end of the power interruption ends the cylical mode of operation.

6 Claims, 2 Drawing Sheets

TIME-KEEPING APPARATUS

This is a continuation of application Ser. No. 824,674, filed Jan. 31, 1986, now abaonded.

FIELD OF THE INVENTION

The present invention relates to the field of time-keeping apparatus, particularly such apparatus as includes provision for keeping time during a period of interruption of a primary supply of operating power.

BACKGROUND OF THE INVENTION

Electronic clocks commonly use the alternating current (AC) power line mains for an accurate time base as well as for their supply of operating power. Such clocks may typically be incorporated in electronic equipment such as video cassette recorders (VCR's), as timers for controlling timed operation and as timepieces for providing a display of the time of day.

Generally, it is desirable to maintain time-keeping during an AC power failure, particularly in a timer controlling the operation of other apparatus. Standby power typically may be provided by a battery or, preferably, a large capacitor. Although in practical terms, a battery can generally provide a greater energy supply than a capacitor of comparable size and cost, batteries are not desirable, particularly in domestic AC line powered apparatus, since periodic replacement may be needed. This is a nuisance and requires access to internal circuit connections which is not desirable from a user safety aspect.

Many timers and clocks, particularly such as are incorporated in modern electronic equipment such as VCR's, employ a microcomputer. During standby periods, the clock oscillator associated with the microcomputer can be used as a reference source for time-keeping. A disadvantage of such a system is that, in order to keep time when AC power has failed, the microcomputer has to run continuously, thus consuming relatively high operating power. As a result, a relatively large standby energy storage capability is needed, so that time-keeping can only be maintained for a relatively short period of time. Furthermore, accurate frequency control is also required in the absence of AC power, and is typically obtained by using a crystal.

SUMMARY OF THE INVENTION

In accordance with an aspect of the invention, apparatus for time-keeping while operating on a standby power supply during an interruption in a main power supply for a clock arrangement uses a microcomputer for generating and storing time information. The microcomputer has selectable normal and standby modes of operation respectively associated with relatively high and relatively low supply power consumption. Sensing circuitry is included for sensing the interruption when the microcomputer is in the normal mode. Controllable delay circuitry is coupled to the sensing circuitry for providing a delay period in response to the sensing circuitry sensing the interruption. Mode selection circuitry is coupled to the microcomputer and to the controllable delay circuitry for performing a cycle of operation by selecting the standby mode in response to the sensing circuitry sensing the interruption and selecting the normal mode in response to the delay period ending, so as to perform the cycle of operation repetitively so long as the sensing means senses the interruption.

In accordance with a further aspect of the invention, the number of times the cycle is performed and the duration of the delay period are stored in the microcomputer.

In accordance with a still further aspect of the invention, the microcomputer augments the time information being stored by the multiplication product of the number count and the delay period. The microcomputer computes the multiplication product in the normal mode selected in response to the delay period ending in the last performance of the cycle in the interruption.

In accordance with another aspect of the invention, the microcomputer augments the time information being stored by the delay period at each performance of the cycle.

DESCRIPTION OF THE PREFERRED EMBODIMENT

Figure 1:
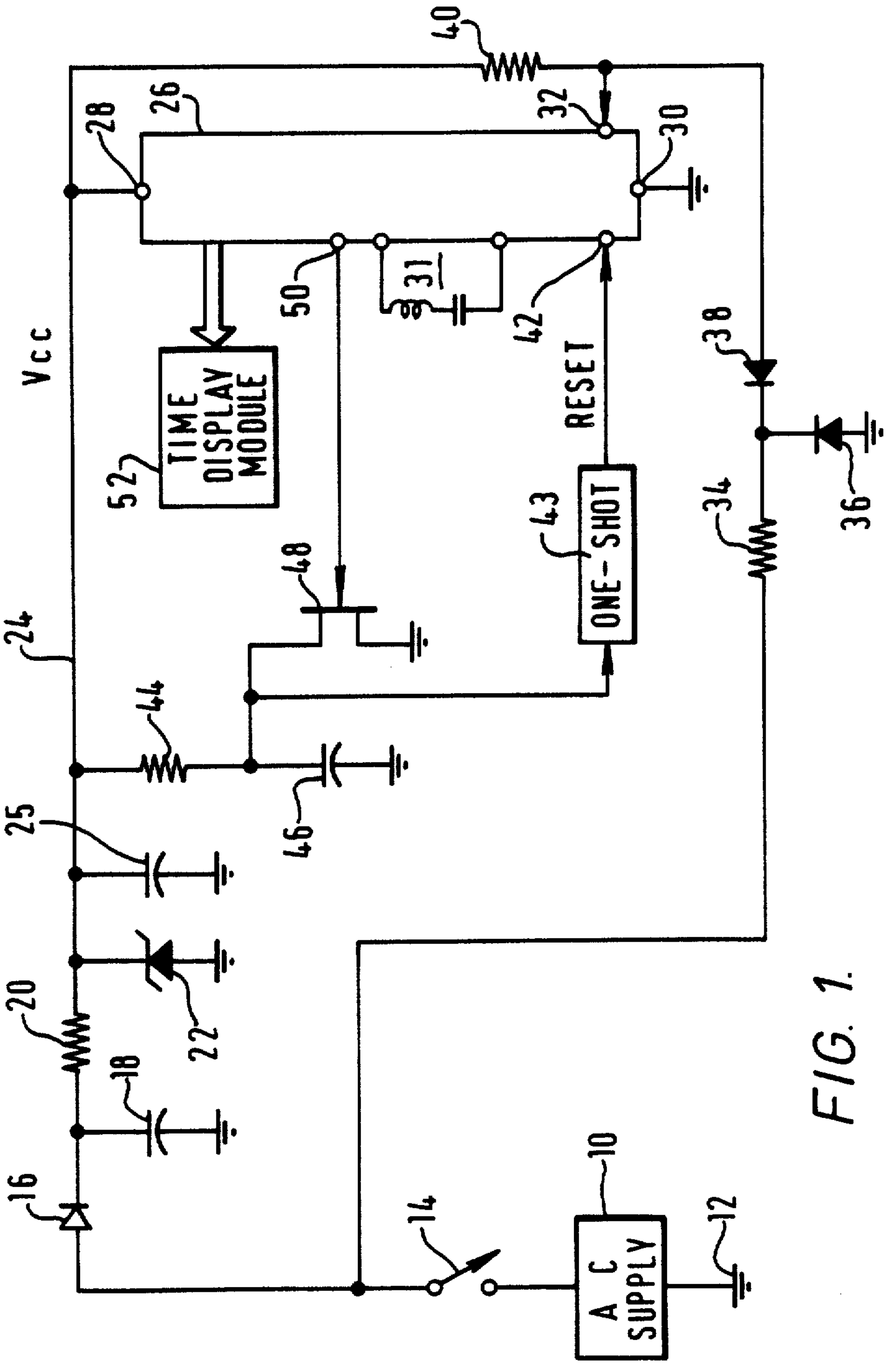
FIG. 1 shows partly in block diagram form and partly in circuit schematic form a time-keeping apparatus for keeping time during a power failure, in accordance with the present invention.

In the time-keeping apparatus of FIG. 1, a supply of DC operating voltage Vcc is derived from the AC power line, represented by block 10. One pole of the supply line is coupled to a ground 12 while the other supply pole is coupled to the apparatus by way of a switch 14, representing an on/off switch. Switch 14 also represents that the AC supply is liable to interruption, as when a power failure occurs. The AC supplied by way of switch 14 when it is closed is rectified by a diode 16 and is applied to a filter and storage capacitor 18. A current limiting resistor 20 supplies DC current from capacitor 18 to a limiting avalanche or Zener diode 22 which stabilizes the operating voltage Vcc at a supply conductor 24 at a suitable value relative to ground. A capacitor 25 coupled in shunt with diode 22 further reduces ripple and provides further energy storage and a low impedance AC shunt path to ground.

A microcomputer 26 which includes a memory is coupled to receive a supply of operating voltage between supply conductor 24 and ground by way of terminals 28 and 30, respectively. A microcomputer considered suitable is the Type HMCS 404, by the Hitachi Company of Japan. An LC tuned circuit 31 is coupled to a clock oscillator in microcomputer 26 for generating a clock signal for clocking of programmed computer operations. The frequency controlled by LC circuit 31 is subject to relatively wide tolerance variations and is therefore unsuitable as a time base for accurate time-keeping. Microcomputer 26 also receives a timing signal by way of a sensing terminal 32. The timing signal is derived from the AC power line voltage supplied by way of switch 14 through a current limiting resistor 34 which is coupled between switch 14 and the joined cathodes of two diodes, 36 and 38. The anode of diode 36 is coupled to ground. The anode of diode 38 is coupled to terminal 32 and also to supply conductor 24 by way of a resistor 40. Diode 36 limits to one forward diode drop the negative voltage excursions at its cathode with respect to ground and thereby clamps negative voltage excursions at terminal 32 at ground potential because of the compensating forward drop of diode 38 which is forward biased by Vcc through resistor 40. During positive voltage excursions of the AC power line voltage, diode 36 is reverse biased and diode 38 becomes reverse biased when the line voltage exceeds Vcc. Accordingly, the timing signal at terminal 32 will be approximately a square wave switching between Vcc and ground potential at the line frequency rate, for example, 60 Hz in the United State. This timing signal provides an accurate time-base and is also utilized by microcomputer 26 to sense when a power interruption has occurred.

Microcomputer 26 has a NORMAL operating mode in which it provides normal computing and memory storage functions. In a STANDBY mode, the contents of the memory are retained but the clock oscillator is stopped and substantially all other functions are disabled, except for the capability of reverting to the NORMAL mode on command. There is also a RESET mode which resembles the STANDBY mode except that the clock oscillator is operating. The RESET mode is employed briefly prior to entering the NORMAL mode.

The STANDBY mode is entered from the NORMAL mode under program control. Returning to the NORMAL mode is achieved by first selecting the RESET mode by applying a positive logic signal to microcomputer 26 by way of a RESET terminal 42 which is normally kept at ground potential. Returning the signal at RESET terminal 42 to ground potential then causes the NORMAL mode to be selected.

RESET terminal 42 is coupled to circuitry, which in conjunction with microcomputer 26 determines mode selection, as will be explained. The output of a one-shot circuit 43, which is triggered when its trigger input voltage exceeds a predetermined trigger level, is coupled to RESET terminal 42. When triggered, one-shot 43 provides a positive output pulse of very brief duration. The trigger input of one-shot 43 is coupled to supply conductor 24 by way of a resistor 44 and to ground by way of a capacitor 46. An n-channel field effect transistor 48 has its drain electrode coupled to the junction of resistor 44 and capacitor 46, and its source electrode coupled to ground. The gate electrode of transistor 48 is coupled to an output terminal 50 of microcomputer 26. A time display module 52 is coupled to microcomputer 26 by way of a multiple data bus, as indicated in FIG. 1 by the broad line, for providing a display of the time of day as determined by the microcomputer.

In operation, AC power is first applied to the FIG. 1 apparatus with no charge present on the capacitors prior to the circuit being energized. On closing switch 14, the clock signal is applied to terminal 32 and the operating voltage Vcc is quickly established at its proper level for microcomputer 26. Transistor 48 remains non-conductive and capacitor 46 is charged at a predetermined rate through resistor 44, causing the voltage at RESET terminal 42 to reach the level for triggering one-shot 43. Microcomputer 26 then briefly enters the RESET mode for the duration of the one-shot period and then enters the NORMAL mode of operation.

This sequence causes microcomputer 26 to operate in a CALIBRATE cycle (in the NORMAL mode), in which it applies a turn-on bias to the gate of transistor 48 by way of terminal 50, causing capacitor 46 to discharge rapidly and substantially completely through the low channel on-resistance.

Microcomputer 26 remains operational and biases transistor 48 off, thus, allowing the voltage at the trigger input of one-shot 43 to begin rising as capacitor 46 begins to recharge. At the same time, microcomputer 26 measures and stores the duration of the time interval required from the time transistor 48 was biased off for the voltage at the trigger input of one-shot 43 to reach the level required to trigger one-shot 43. Thereafter, microcomputer 26 enters the RESET mode for the duration of the one-shot period and then returns to the NORMAL mode for its normal operations, including time-keeping and providing a time display in module 52. The time of day information is derived by utilizing the timing signal at terminal 32. It is stored in memory and is continually updated as required.

When a power failure occurs, the clock signal at terminal 32 will stop immediately, whereas Vcc will be maintained for a time by the charge on capacitors 18 and 25, thus maintaining microcomputer 26 operational. When the clock signal stops, microcomputer 26 biases transistor 48 on, thereby starting to discharge rapidly capacitor 46 and causing the voltage at the trigger input of one-shot 43 to fall to ground level. Thereafter, microcomputer 26 enters the STANDBY mode under program control. As explained, this causes substantially all microcomputer functions to cease except for memory retention. Transistor 48 is no longer biased on and capacitor 46 begins to recharge causing the voltage at terminal 50 to reach the level for triggering one-shot 43 after a time interval, this being the same time interval whose duration was previously measured and stored in the CALIBRATE cycle as was described. When one-shot 43 is triggered, its output pulse causes microcomputer 26 to enter the RESET mode briefly and then to enter the NORMAL mode when the output pulse ends. Microcomputer 26 then retrieves the time interval duration information from memory and uses it to increment the stored time of day information. This involves augmenting the stored time of day information by the actual time interval duration and is accomplished in a very brief interval. Thereafter, microcomputer 26 biases transistor 48 on to discharge capacitor 46 and returns to its STANDBY under program control after the voltage on capacitor 46 falls to ground level. Transistor 48 is made nonconductive, capacitor 46 begins to recharge again and the cyclical mode of operation continues and maintains the correct time of day so long as the charge on capacitors 18 and 25 is sufficient, until AC power is restored.

The time required for switching operations is very short and may be neglected in comparison with the time interval during which capacitor 46 is being charged. It is noted that the controllable delay time provided by the time constant of resistor 44 and capacitor 46 does not have to be known exactly for maintaining exact time. The stored time interval duration information, however, is precise, being the result of the time measurement performed in the CALIBRATE cycle using the AC line frequency clock signal, as previously explained. In the cyclical mode of operation, microcomputer 26 remains in the STANDBY mode of operation for most of the time, the periods of NORMAL operation being very brief in comparison. Typically, the power consumption may be ten times greater in the NORMAL mode than in the STANDBY mode, e.g. 100 microamperes and 10 microamperes, respectively. Accordingly, considerable economy in the STANDBY power requirements is achieved by the cyclical mode of operation which requires only recurrent brief intervals of operation in the NORMAL mode.

Figure 2:
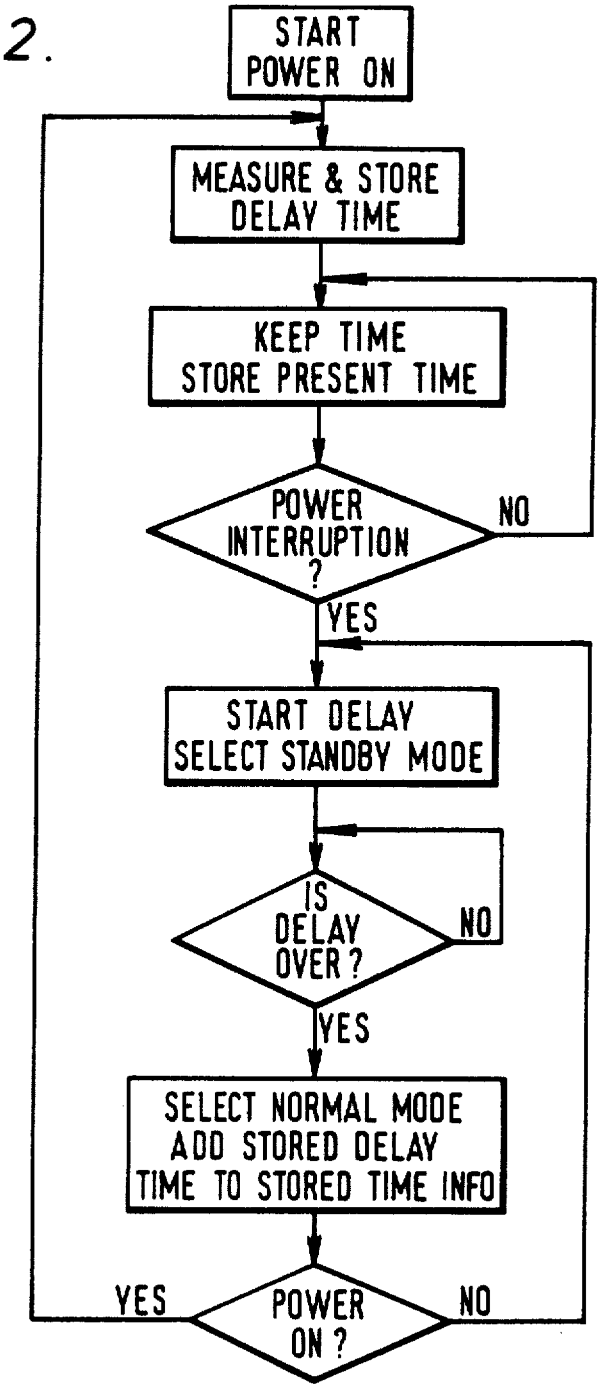
FIG. 2 shows a flow chart indicating certain operations useful in facilitating an understanding of the operation of the invention.

A part of this sequence of operation is shown in the simplified flow chart in FIG. 2. When power is first applied at START, the delay period time is measured and stored in the microcomputer. When power is interrupted, the delay time starts to run and the microcomputer STANDBY mode is selected. When the delay period is completed, the microcomputer NORMAL mode is selected and the stored time information is updated by adding to it the stored value of the delay period time. The cycle is repeated until the power interruption is over, whereupon the operation returns to the START condition.

The implementation of the invention in accordance with FIGS. 1 and 2 is illustrative. Various modifications will readily suggest themselves to one skilled in the art for implementing the invention in accordance with the present description. For example, in the described embodiment, the time interval for discharging capacitor 46 by means of transistor 48 has been assumed to be negligibly short. In a different arrangement, this assumption may not be justifiable and it is then desirable to measure and store the total time interval duration required for charging and discharging capacitor 46 in a CALIBRATE cycle. The total time duration is then used to increment the time of day. Also, it is not essential that a CALIBRATE cycle be employed each time power is restored, since the time constant of resistor 44 and capacitor 46 is not likely to change much over a considerable period of time. In such a case, it is possible to make the measurement once initially, for example using factory equipment, and to store the reading for use in operation. Furthermore, while the time of day is incremented at every cycle in the described embodiment, this is not essential. In an alternative embodiment, only the number of cycles is counted and the computation of total elapsed time as the product of the number of cycles and the stored time interval is performed only when AC power is restored. It is also clear that a battery may be employed instead of capacitor energy storage as shown in the exemplary embodiment. It is also noted that the need for using one-shot 43 arises with the particular type of microcomputer utilized in the described embodiment. Another type of microcomputer having different mode selection signal requirements may not require a one-shot. Such modifications are contemplated to be within the scope of the present invention.

What is claimed is:

1. Apparatus for keeping the time of day, comprising:

an input for receiving an AC power line voltage subject to interruption;

processor means, including a source of clock signals, and a memory for storing a program of operating instructions;

said processor means operating in a normal mode while said AC power line voltage is present to keep the time of day by counting cycles of said AC power line voltage; and an R-C network input for producing a varying voltage when triggered;

said processor means operating to determine the duration of said interruption of said AC power line voltage so that the time of day can be updated by repetitively triggering said R-C network to produce repetitive cycles of said varying voltage during said power interruption, said cycles each consisting essentially of a voltage ramp from a first predetermined voltage level to a second predetermined voltage level and having the same substantially constant duration; and calculating the time duration of said power interruption by measuring said substantially constant duration of said cycles and multiplying said substantially constant duration of said cycles by the number of cycles occurring during said power interruption.

2. The time-keeping apparatus recited in claim 1 wherein:

said processor means switches to a standby mode of operation in which less power is consumed during said power interruption and snitches momentarily to said normal mode of operation to trigger said R-C network in response to each development of said second voltage level.

3. The time-keeping apparatus recited in claim 2 wherein said processor means counts cycles of said varying voltage occurring during said power interruption and calculates the duration of said power interruption when said AC power line voltage returns after said power interruption.

4. The time-keeping apparatus recited in claim 2 wherein said multiplication is effected by repeated addition of said substantially constant duration of each of said cycles, each of said additions occurring when said processor enters said normal mode during said power interruption.

5. The time-keeping apparatus recited in claim 1 further including means for resetting said R-C network, said means for resetting being coupled to said processor and responsive to an output signal of said processor for resetting said R-C network to said first predetermined voltage level.

6. The time-keeping apparatus recited in claim 1 wherein said processor means further includes a data memory not subject to loss of information during said power interruption, said substantially constant duration of change of said voltage from said first predetermined voltage level to said second predetermined voltage level is measured by counting cycles of said AC power line voltage before said power interruption occurs, and said duration is stored in said data memory. .

* * * * *

UNITED STATES PATENT AND TRADEMARK OFFICE
CERTIFICATE OF CORRECTION

PATENT NO. : 4,905,187

DATED : February 27, 1990

INVENTOR(S) : Billy W. Beyers, Jr.

It is certified that error appears in the above-identified patent and that said Letters Patent is hereby corrected as shown below:

Column 6, line 26 (Claim 2): that portion reading "snitches" should read -- switches --.

Column 6, line 52 (Claim 6): after "of" and before "change" insert -- said --.

Signed and Sealed this

First Day of January, 1991

*Attest:*

HARRY F. MANBECK, JR.

*Attesting Officer* *Commissioner of Patents and Trademarks*